US011251267B2

(12) United States Patent
Bi et al.

(10) Patent No.: US 11,251,267 B2
(45) Date of Patent: *Feb. 15, 2022

(54) VERTICAL TRANSISTORS WITH MULTIPLE GATE LENGTHS

(71) Applicant: INTERNATIONAL BUSINESS MACHINES CORPORATION, Armonk, NY (US)

(72) Inventors: Zhenxing Bi, Schenectady, NY (US); Kangguo Cheng, Schenectady, NY (US); Peng Xu, Guilderland, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 84 days.

This patent is subject to a terminal disclaimer.

(21) Appl. No.: 16/684,022

(22) Filed: Nov. 14, 2019

(65) Prior Publication Data

US 2020/0098863 A1 Mar. 26, 2020

Related U.S. Application Data

(60) Continuation of application No. 16/238,982, filed on Jan. 3, 2019, now Pat. No. 10,553,682, which is a division of application No. 15/789,549, filed on Oct. 20, 2017, now Pat. No. 10,211,288.

(51) Int. Cl.
*H01L 29/08* (2006.01)
*H01L 27/088* (2006.01)
(Continued)

(52) U.S. Cl.
CPC .. *H01L 29/0847* (2013.01); *H01L 21/823412* (2013.01); *H01L 21/823487* (2013.01);
(Continued)

(58) Field of Classification Search
CPC ............... H01L 21/823418; H01L 21/823807
See application file for complete search history.

(56) References Cited

U.S. PATENT DOCUMENTS 6,660,590 B2 12/2003 Yoo
6,846,709 B1 1/2005 Lojek
(Continued)

OTHER PUBLICATIONS

List of IBM Patents or Patent Applications Treated as Related dated Nov. 14, 2019, 2 pages.
(Continued)

*Primary Examiner* — Walter H Swanson
(74) *Attorney, Agent, or Firm* — Tutunjian & Bitetto, P.C.; Randall Bluestone

(57) ABSTRACT

A pair of vertical fin field effect transistors (FinFETs) having different gate lengths, includes, a first bottom source/drain on a first region of a substrate, wherein the first bottom source/drain includes a first tier having a first height adjacent to a first vertical fin and a second tier having a second height greater than the first tier removed from the first vertical fin; and a second bottom source/drain on a second region of the substrate, wherein the second bottom source/drain includes a third tier having a third height adjacent to a second vertical fin and a fourth tier having a fourth height greater than the third tier removed from the second vertical fin, wherein the third height is less than the first height and the fourth height is equal to the second height.

20 Claims, 9 Drawing Sheets

(51) Int. Cl.
  *H01L 21/8234* (2006.01)
  *H01L 29/78* (2006.01)
  *H01L 29/786* (2006.01)
  *H01L 21/8238* (2006.01)
  *H01L 27/092* (2006.01)

(52) U.S. Cl.
  CPC ........ *H01L 27/088* (2013.01); *H01L 29/7827* (2013.01); *H01L 29/78642* (2013.01); *H01L 21/823418* (2013.01); *H01L 21/823807* (2013.01); *H01L 21/823885* (2013.01); *H01L 27/092* (2013.01)

(56) References Cited

U.S. PATENT DOCUMENTS

| | | |
|---|---|---|
| 7,033,877 B2 | 4/2006 | Chaudhry et al. |
| 7,282,772 B2 | 10/2007 | Anderson et al. |
| 8,080,458 B2 | 12/2011 | Masuoka et al. |
| 9,245,885 B1 | 1/2016 | Xie et al. |
| 9,287,362 B1 | 3/2016 | Basu et al. |
| 9,450,095 B1* | 9/2016 | Bergendahl ..... H01L 21/823814 |
| 9,570,356 B1* | 2/2017 | Balakrishnan ...... H01L 29/0847 |
| 2017/0178970 A1 | 6/2017 | Anderson et al. |

OTHER PUBLICATIONS

B.A. Anderson et al., "Variable Gate Lengths for Vertical Transistors," U.S. Appl. No. 14/970,624, filed Dec. 16, 2015. pp. 1-27.

K. Cheng et al., "Vertical Transistor with Variable Gate Length," U.S. Appl. No. 15/196,774, filed Jun. 29, 2016. pp. 1-34.

K. Cheng et al., "Gate Length Controlled Vertical FETs," U.S. Appl. No. 15/206,939, filed Jul. 11, 2016. pp. 1-22.

List of IBM Patents or Patent Applications Treated as Related dated Jan. 3, 2019, 2 pages.

* cited by examiner

VERTICAL TRANSISTORS WITH MULTIPLE GATE LENGTHS

BACKGROUND

Technical Field

The present invention generally relates to vertical fin field effect devices having different gate lengths, and more particularly to fabricating vertical transport fin field effect transistors (VT FinFET) using spacer layers with different thicknesses on different regions of a substrate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a pair of vertical fin field effect transistors (FinFETs) having different gate lengths is provided. The pair of vertical fin field effect transistors includes a first bottom source/drain on a first region of a substrate, wherein the first bottom source/drain includes a first tier having a first height adjacent to a first vertical fin and a second tier having a second height greater than the first tier removed from the first vertical fin. The pair of vertical fin field effect transistors further includes a second bottom source/drain on a second region of the substrate, wherein the second bottom source/drain includes a third tier having a third height adjacent to a second vertical fin and a fourth tier having a fourth height greater than the third tier removed from the second vertical fin, wherein the third height is less than the first height and the fourth height is equal to the second height.

In accordance with another embodiment of the present invention, a method of forming a pair of vertical fin field effect transistors (FinFETs) having different gate lengths is provided. The method includes forming two vertical fins on a substrate, wherein a first vertical fin is on a first region of the substrate and a second vertical fin is on a second region of the substrate. The method further includes forming a sacrificial gap layer on the substrate and the two vertical fins. The method further includes forming a bottom augmentation segment on the sacrificial gap layer and first vertical fin on the first region of the substrate. The method further includes forming a sidewall spacer on the first vertical fin. The method further includes forming a sidewall spacer on the second vertical fin. The method further includes removing the bottom augmentation segment and the sacrificial gap layer, wherein a lower portion of the first vertical fin and a lower portion of the second vertical fin are exposed. The method further includes forming a first bottom source/drain on the first region of the substrate and the first vertical fin, wherein the first bottom source/drain includes a first tier having a first height adjacent to a first vertical fin and a second tier having a second height greater than the first tier adjacent to the sidewall of the sidewall spacer on the first vertical fin.

In accordance with yet another embodiment of the present invention, a method of forming a pair of vertical fin field effect transistors (FinFETs) having different gate lengths is provided. The method includes forming an isolation region in a substrate to divide the substrate into a first region and a second region. The method further includes forming a first vertical fin on the first region of the substrate and a second vertical fin on the second region of the substrate. The method further includes forming a sacrificial gap layer on the substrate. The method further includes forming a bottom augmentation layer on the sacrificial gap layer. The method further includes removing a portion of the bottom augmentation layer on the second region of the substrate to leave a bottom augmentation segment on the first region of the substrate, wherein the bottom augmentation segment and sacrificial gap layer covers a lower portion of the first vertical fin. The method further includes forming a sidewall spacer on the first vertical fin and a sidewall spacer on the second vertical fin. The method further includes removing the bottom augmentation segment and the sacrificial gap layer, wherein a lower portion of the first vertical fin and a lower portion of the second vertical fin are exposed. The method further includes forming a first bottom source/drain on the first region of the substrate and the first vertical fin, wherein the first bottom source/drain includes a first tier having a first height adjacent to a first vertical fin and a second tier having a second height greater than the first tier adjacent to the sidewall of the sidewall spacer on the first vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to the fabrication of devices having gate structures with different gate lengths on different regions of a substrate. The gate structures can be on vertical fins forming vertical transport fin field effect transistors (VT FinFETs) fabricated on adjoining regions of a semiconductor substrate, or on regions of a semiconductor substrate separated by intervening regions. The intervening regions may contain other fabricated devices.

Embodiments of the present invention relate generally to forming a bottom augmentation layer on a sacrificial gap layer to control the positioning and length of sidewall spacers formed on vertical fins, where the bottom augmentation layer can affect the available height of the vertical fins exposed for formation of the sidewall spacers. The bottom augmentation layer can prevent the formation of a sidewall spacer layer on a bottom portion of a subset of the vertical fins on a first region of a substrate.

Embodiments of the present invention relate generally to forming arrays of transistors (e.g., VT FinFETs) fabricated for use in mobile devices, where a combination of low leakage current and higher speed performance can optimize function and battery life. The transistors on different regions can be configured to have different speed and leakage current properties depending on the predetermined gate lengths.

Embodiments of the present invention also relate generally to producing VT FinFETs with different gate length, Lg, through controlled layer thicknesses and removal, since the gate length is not defined by lithography.

Exemplary applications/uses to which the present invention can be applied include, but are not limited to: arrays of transistors (e.g., VT FinFETs) fabricated for use in mobile devices, where a combination of low leakage current and higher speed performance can optimize function performance and battery life.

Figure 1:
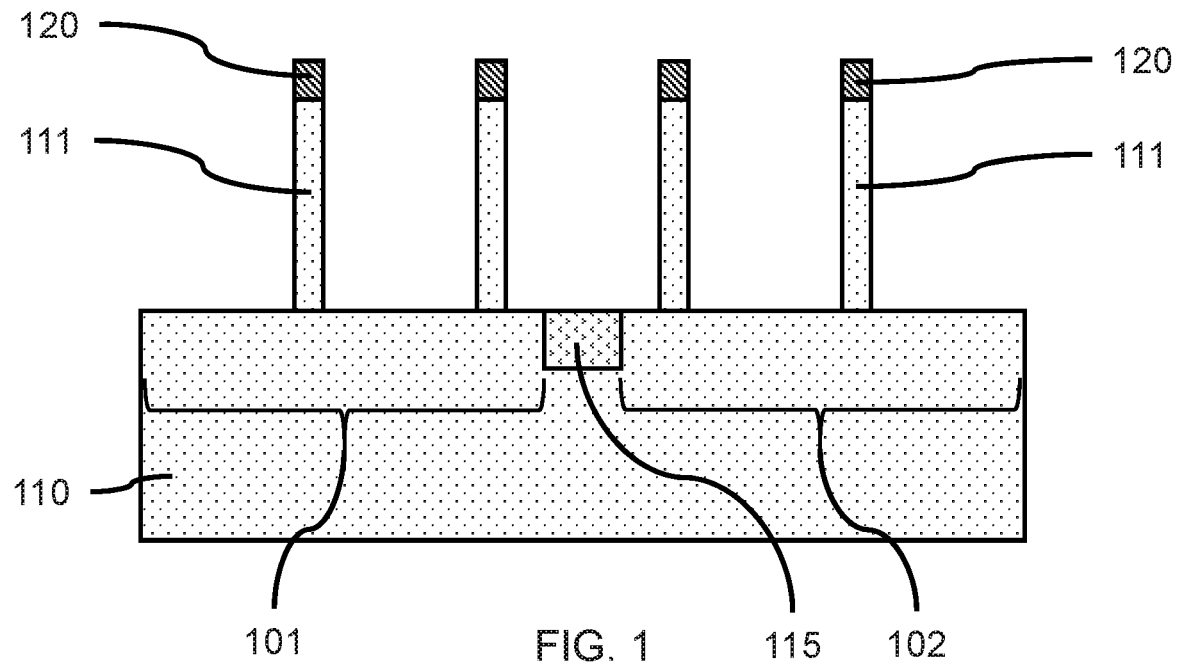
FIG. 1 is a cross-sectional side view showing a plurality of vertical fins on a substrate with an isolation region, in accordance with an embodiment of the present invention.

Referring now to the drawings in which like numerals represent the same or similar elements and initially to FIG. 1, a cross-sectional side view showing a plurality of vertical fins on a substrate with an isolation region is shown, in accordance with an embodiment of the present invention.

In one or more embodiments, a plurality of vertical fins 111 can be formed on a substrate 110, wherein the vertical fin extend away from an exposed surface of the substrate. The vertical fins and substrate can be formed from a semiconductor material, where the vertical fins can be the same material as the substrate or a different semiconductor material from the substrate. The vertical fins can be etched or grown.

A substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., SiO$_2$) or an implanted layer forming a buried insulating material.

In one or more embodiments, an isolation region 115 (e.g., a shallow trench isolation region) can be formed in the substrate 110, where the isolation region can include an insulating dielectric material (e.g., SiO$_2$) to prevent or reduce electrical conduction between different regions of the substrate 110. The isolation region 115 can have a width of at least 100 nm or about 100 nm to about 250 nm to physically and electrically separate adjacent regions of the substrate. One or more vertical fins 111 can be formed on each side of the isolation region 115, wherein the isolation region separates the substrate into two different regions, for example, a first region 101 and a second region 102. One or more vertical fins 111 formed in the first region 101 can be configured to form n-type fin field effect transistors (FinFETs), and one or more vertical fins 111 formed in the second region 102 can be configured to form p-type fin field effect transistors, although the arrangement can be reversed or the same type can be formed on both regions, and/or with different gate lengths.

The substrate 110 may include dopants to form a punch-through stop layer.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

In various embodiments, a fin template 120 may be on each vertical fin 111, where the fin template 120 is formed during the patterning process. The fin templates 120 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template 120.

Figure 2:
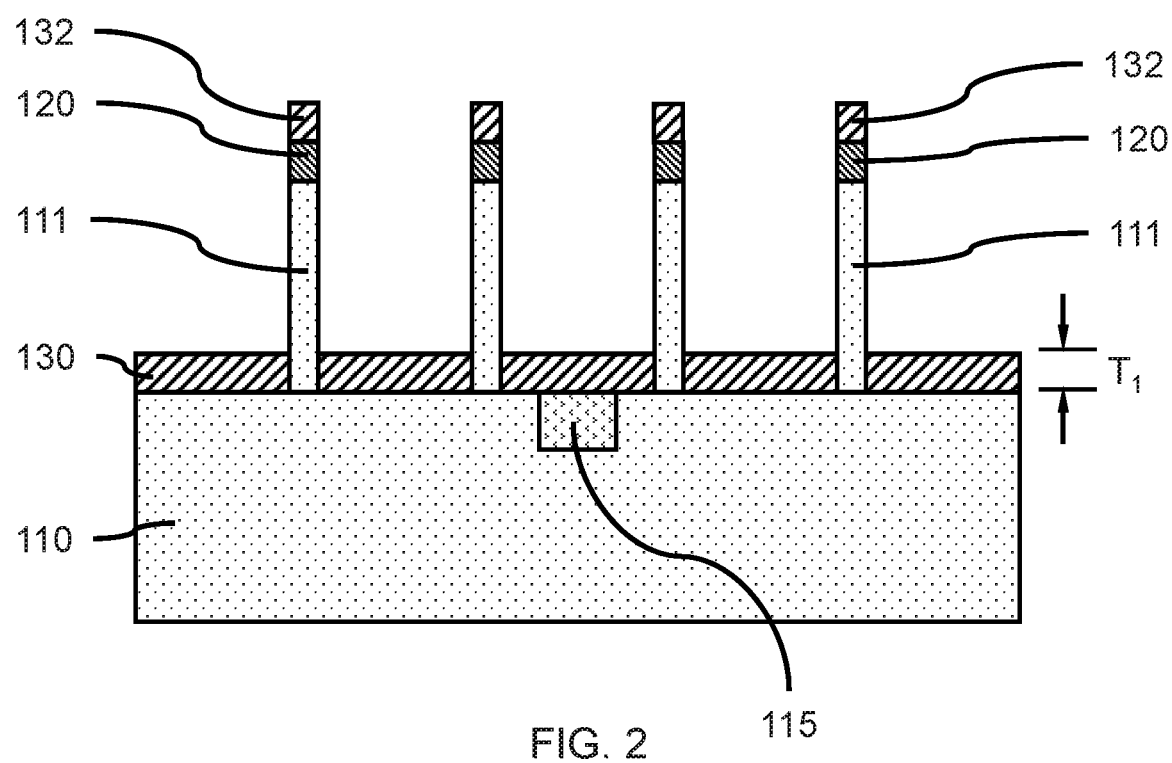
FIG. 2 is a cross-sectional side view showing a sacrificial gap layer on the substrate, vertical fins, and isolation region, in accordance with an embodiment of the present invention.

FIG. 2 is a cross-sectional side view showing a sacrificial gap layer on the substrate, vertical fins, and isolation region, in accordance with an embodiment of the present invention.

In one or more embodiments, a sacrificial gap layer 130 can be formed on the exposed surface of the substrate 110 and isolation region 115. In various embodiments, the sacrificial gap layer 130 can be formed by a subtractive method, where the sacrificial gap layer is formed over the top surfaces of the fin templates 120, and the height of the sacrificial gap layer reduced by a chemical-mechanical polishing (CMP) and etching to a predetermined thickness, $T_1$. In various embodiments, the sacrificial gap layer 130 can be formed by a high density plasma (HDP) deposition process, where the sacrificial gap layer 130 is directionally formed on the exposed, top surfaces of the substrate 110 and fin templates 120. The deposition can form sacrificial caps 132 on the top surfaces of the fin templates 120. The sacrificial caps 132 and fin templates 120 can be different materials.

In various embodiments, an etch-back process can be used to remove material deposited on fin sidewalls by the HDP process, leaving deposited material only on the horizontal surfaces. A directional deposition (e.g., gas cluster ion beam (GCIB)) can be used to deposit the sacrificial gap layer 130 on the horizontal surfaces without depositing on the vertical fin sidewalls.

In one or more embodiments, the sacrificial gap layer 130 can be any suitable material, including but not limited to a dielectric oxide (e.g., silicon oxide (SiO), carbon-doped silicon oxide (SiO:C)), or a dielectric nitride (e.g., silicon nitride (SiN), silicon boronitride (SiBN), silicon borocarbonitride (SiBCN), silicon oxyboronitride (SiOBN), silicon oxycarbonitride (SiOCN)), or combinations thereof.

In one or more embodiments, the sacrificial gap layer 130 can have a thickness, $T_1$, in the range of about 15 nm to about 40 nm, or in the range of about 20 nm to about 30 nm, although other thicknesses are also contemplated.

Figure 3:
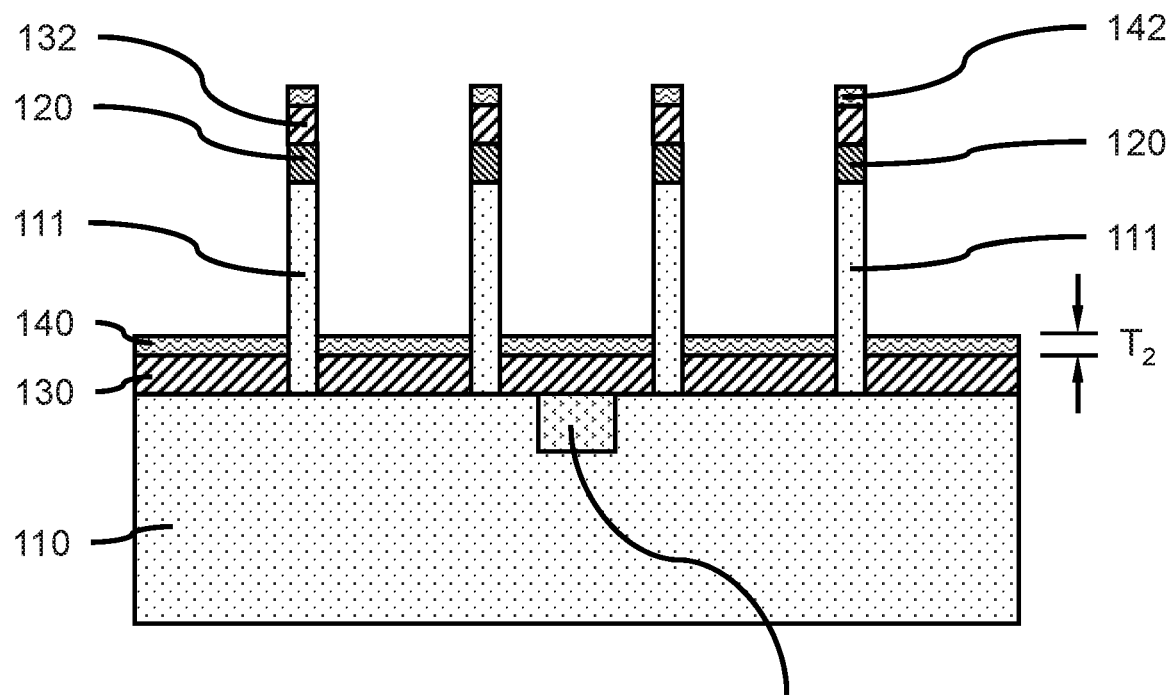
FIG. 3 is a cross-sectional side view showing a bottom augmentation layer on the sacrificial gap layer, in accordance with an embodiment of the present invention.

FIG. 3 is a cross-sectional side view showing a bottom augmentation layer on the sacrificial gap layer, in accordance with an embodiment of the present invention.

In one or more embodiments, a bottom augmentation layer 140 can be formed on the exposed surface of the sacrificial gap layer 130, wherein the bottom augmentation layer 140 can be adjacent to the sidewalls of a lower portion of the vertical fins 111.

In various embodiments, the bottom augmentation layer 140 can be formed by a gas cluster ion beam (GCIB) deposition process, where the sacrificial gap layer 130 is directionally formed on the exposed, top surfaces of the substrate 110 and fin templates 120. Formation of the bottom augmentation layer 140 can form residual layers 142 on the top surfaces of fin templates 120.

In one or more embodiments, the bottom augmentation layer 140 can be formed of the same materials as the sacrificial gap layer 130. The bottom augmentation layer 140 and sacrificial gap layer 130 can also be different materials, so the bottom augmentation layer 140 can be selectively removed relative to the sacrificial gap layer 130, for example, by a selective directional etch (e.g., reactive ion etch (RIE) or a selective isotropic etch (e.g., wet chemical etch)).

In one or more embodiments, the bottom augmentation layer 140 can have a thickness, $T_2$, in the range of about 2 nm to about 5 nm, or in the range of about 3 nm to about 4 nm, although other thicknesses are also contemplated.

Figure 4:
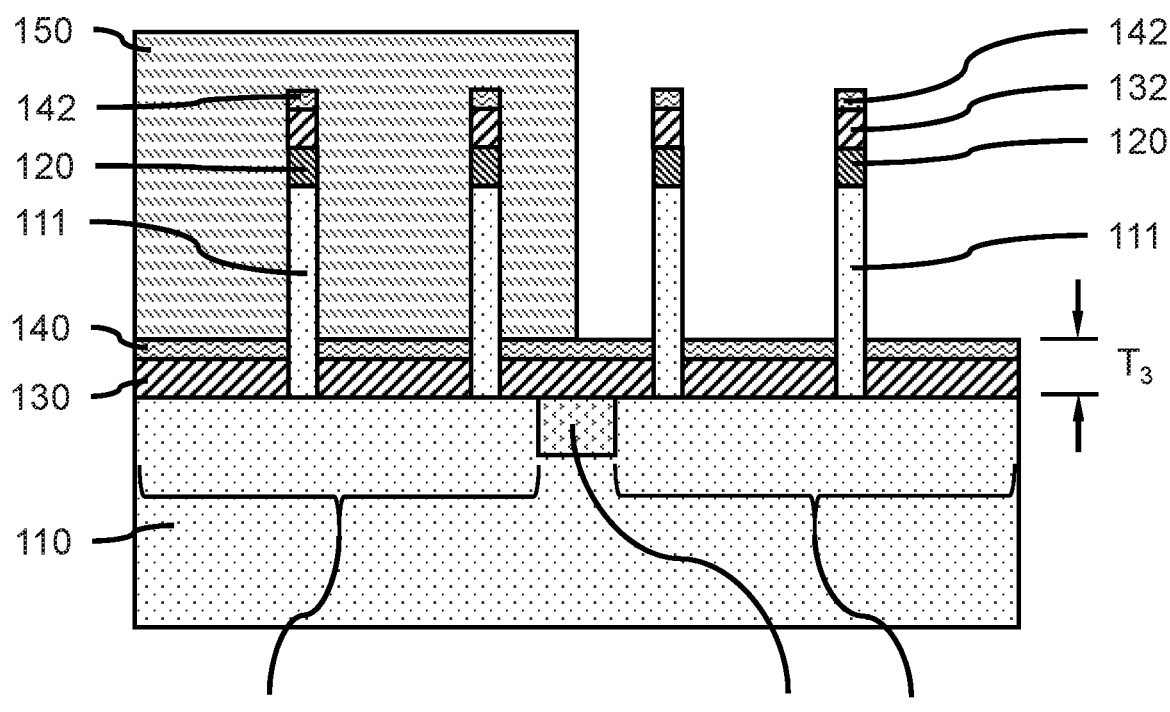
FIG. 4 is a cross-sectional side view showing a mask layer on a portion of the bottom augmentation layer on a first region of the substrate, in accordance with an embodiment of the present invention.

FIG. 4 is a cross-sectional side view showing a mask layer on a portion of the bottom augmentation layer on a first region of the substrate, in accordance with an embodiment of the present invention.

In one or more embodiments, a mask layer 150 can be formed on a portion of the bottom augmentation layer 140, where the mask layer 150 can be formed and patterned by lithographic methods. A portion of the mask layer 150 can be removed to expose a portion of the bottom augmentation layer 140 on a second region 102 of the substrate, while a portion of the mask layer 150 remains on the bottom augmentation layer 140 and vertical fins on the second region 101. A portion of the mask layer 150 can overlap a portion of the isolation region 115.

The mask layer 150 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

The bottom augmentation layer 140 and sacrificial gap layer 130 can have a combined thickness, $T_3$, wherein the combined thickness, $T_3$, can be in the range of about 17 nm to about 45 nm, or in the range of about 22 nm to about 30 nm.

Figure 5:
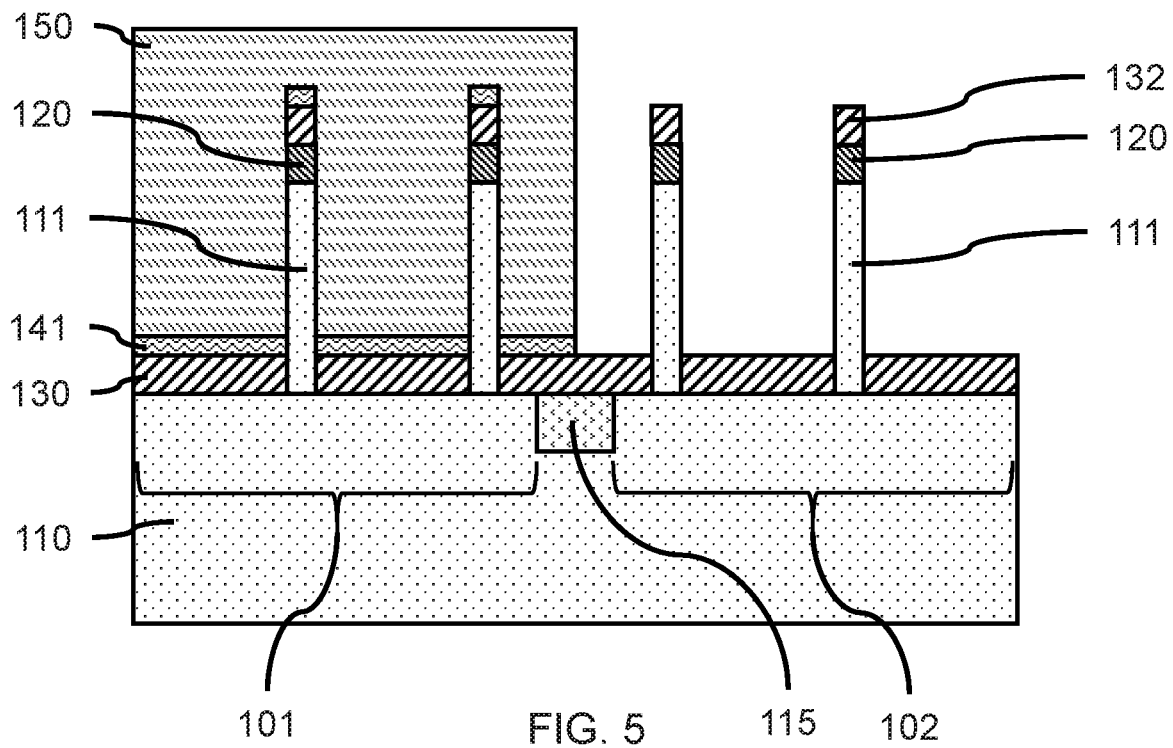
FIG. 5 is a cross-sectional side view showing a portion of the bottom augmentation layer on a second region of the substrate removed from the sacrificial gap layer, in accordance with an embodiment of the present invention.

FIG. 5 is a cross-sectional side view showing a portion of the bottom augmentation layer on a second region of the substrate removed from the sacrificial gap layer, in accordance with an embodiment of the present invention.

In one or more embodiments, an exposed portion of the bottom augmentation layer 140 can be removed to expose the underlying sacrificial gap layer 130. A bottom augmentation segment 141 can remain on a portion of the sacrificial gap layer 130 and substrate 110 in the first region 101. The bottom augmentation segment 141 can reduce the length of the vertical fin sidewall covered by the mask layer 150 and subsequently formed sidewall spacer layer in the first region 101. The sacrificial gap layer 130 can act as an etch stop for selective removal of the exposed portion of bottom augmentation layer 140. Bottom augmentation segment thickness can control the difference in gate lengths.

Figure 6:
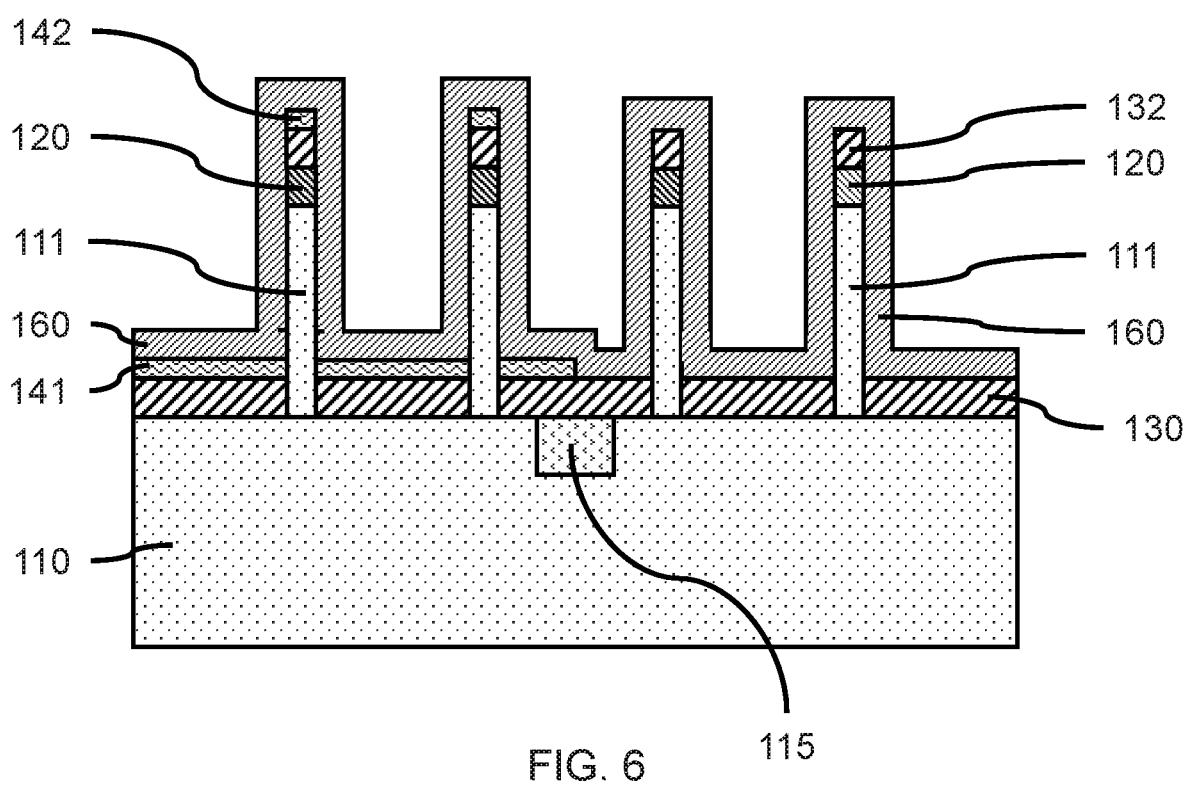
FIG. 6 is a cross-sectional side view showing a sidewall spacer layer formed on the exposed surfaces of the vertical fins, bottom augmentation layer, and sacrificial gap layer, in accordance with an embodiment of the present invention.

FIG. 6 is a cross-sectional side view showing a sidewall spacer layer formed on the exposed surfaces of the vertical fins, bottom augmentation segment, and sacrificial gap layer, in accordance with an embodiment of the present invention.

Figure 10:
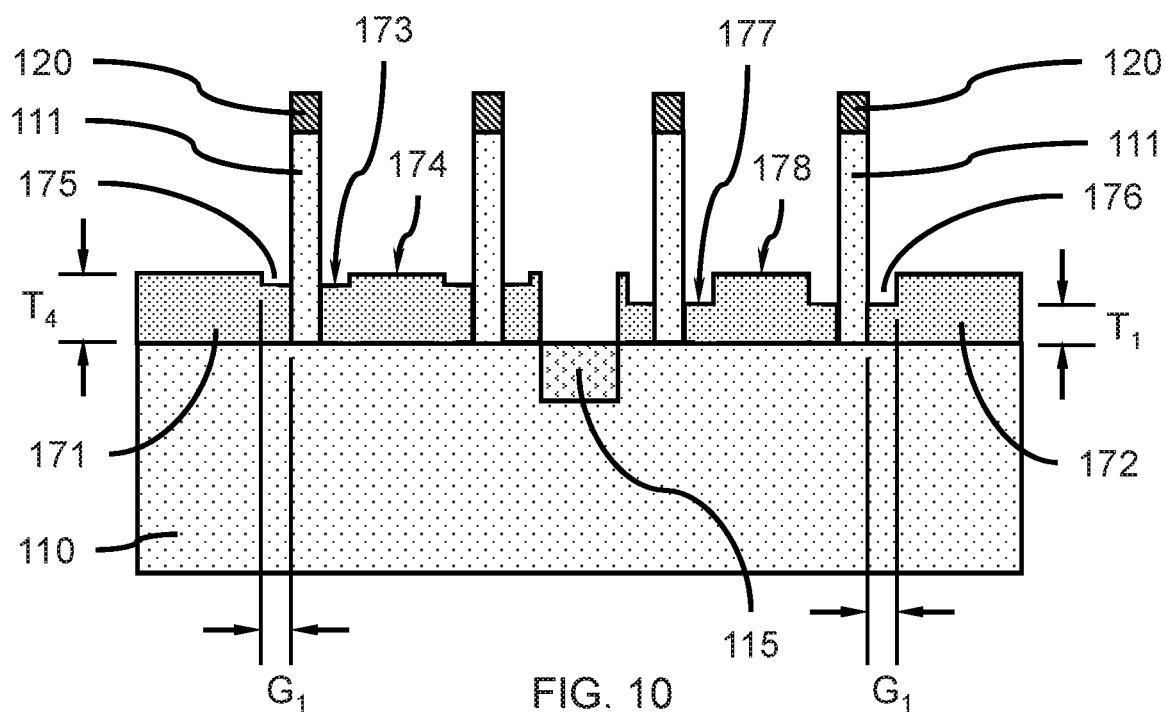
FIG. 10 is a cross-sectional side view showing vertical fins with different exposed sidewalls lengths after removal of the sidewall spacers, in accordance with an embodiment of the present invention.

In one or more embodiments, a sidewall spacer layer 160 can be formed on the exposed surfaces of the vertical fins 111, bottom augmentation segment 141, and sacrificial gap layer 130, wherein the sidewall spacer layer 160 can be formed by a conformal deposition (e.g., atomic layer deposition (ALD), plasma enhanced ALD (PEALD), chemical vapor deposition (CVD), plasma enhanced CVD (PECVD), or a combination thereof. The thickness of the sidewall spacer layer 160 on the horizontal and vertical surfaces can be controlled to establish a width, $G_1$, of an offset gap 175 between a first tier of a bottom source/drain 171, 172 having a first height adjacent to a lower portion of a vertical fin 111 and a second tier of the source/drain layer having a second height removed from the sidewall of the vertical fin 111, as shown in FIG. 10.

In various embodiments, a sidewall spacer layer 160 can have a thickness in the range of about 6 nm to about 18 nm, or in the range of about 6 nm to about 15 nm, or in the range of about 9 nm to about 12 nm, although other thicknesses are also contemplated. The sidewall spacer layer 160 can have a thickness that is about 3× (i.e., about three times) the thickness of a subsequently formed gate dielectric layer.

In one or more embodiments, the sidewall spacer layer 160 can be selected from the same materials as the bottom augmentation layer 140 and sacrificial gap layer 130. The sidewall spacer layer 160, bottom augmentation layer 140 and sacrificial gap layer 130 can be different materials, so that each of the sidewall spacer layer 160, bottom augmentation layer 140, and sacrificial gap layer 130 can be selectively removed relative to the others, for example, by a selective directional etch (e.g., reactive ion etch (RIE)) or isotropic etch (e.g., wet chemical etch) to allow selective removal of the structures.

Figure 7:
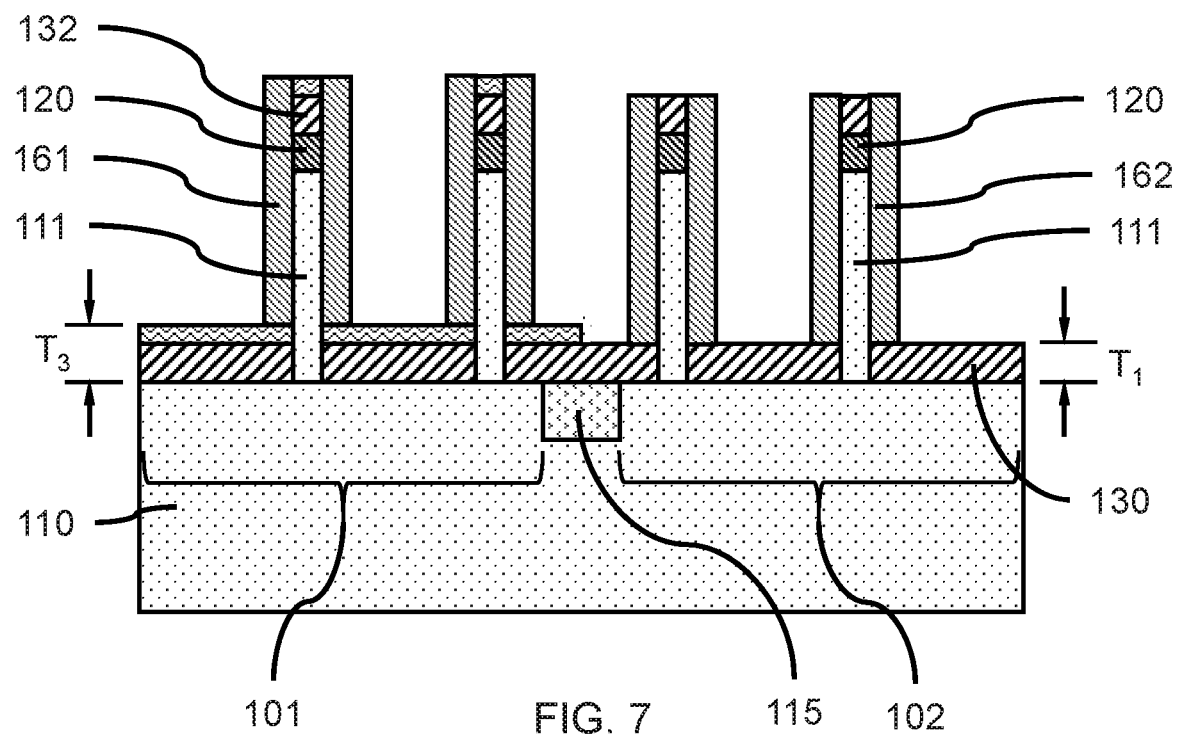
FIG. 7 is a cross-sectional side view showing sidewall spacers on the vertical fin sidewalls after removal of the sidewall spacer layer from portions of the bottom augmentation layer and sacrificial gap layer, in accordance with an embodiment of the present invention.

FIG. 7 is a cross-sectional side view showing sidewall spacers on the vertical fin sidewalls after removal of the sidewall spacer layer from portions of the bottom augmentation segment and sacrificial gap layer, in accordance with an embodiment of the present invention.

In one or more embodiments, sidewall spacers 161 can remain on the vertical fin sidewalls after removal of portions of the sidewall spacer layer 160 from the bottom augmentation segment 141 and sacrificial gap layer 130. The portions of the sidewall spacer layer 160 can be removed using a directional etch (e.g., RIE) that leaves portions of the sidewall spacer layer 160 on the vertical fins 111. The portion of the sidewall spacers 161 on the vertical fins 111 on the first region 101 of the substrate 110 can have a shorter length than the portion of the sidewall spacers 162 on the vertical fins 111 on the second region 102 of the substrate. The difference in length of the sidewall spacers 161, 162 can be the thickness, $T_2$, of the bottom augmentation segment 141.

Figure 8:
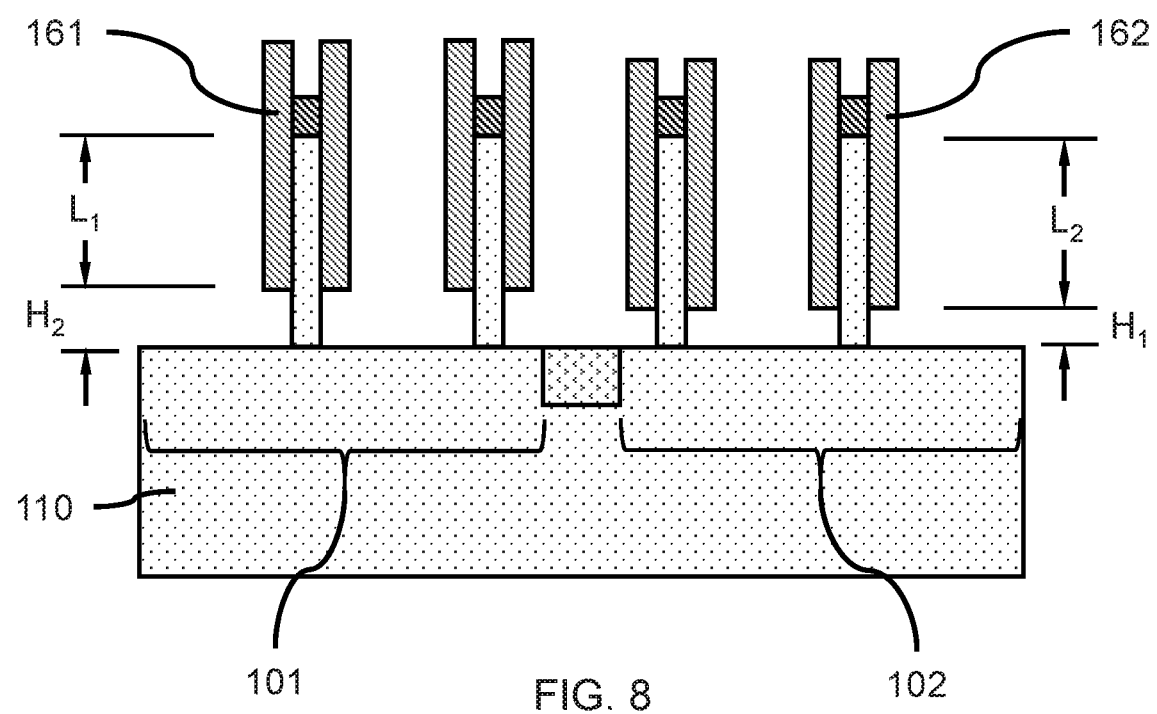
FIG. 8 is a cross-sectional side view showing the sidewall spacers after removal of the bottom augmentation segment and sacrificial gap layer, in accordance with an embodiment of the present invention.

FIG. 8 is a cross-sectional side view showing the sidewall spacers after removal of the bottom augmentation segment and sacrificial gap layer, in accordance with an embodiment of the present invention.

In one or more embodiments, the bottom augmentation segment 141 and sacrificial gap layer 130 can be removed sequentially by selective etching, where sidewall spacers 161, 162 remain on the vertical fins 111. The bottom augmentation segment 141 and sacrificial gap layer 130 can be removed using an isotropic etch (e.g., wet chemical etch, plasma etch) that can remove the portions of bottom augmentation segment 141 and sacrificial gap layer 130 under the sidewall spacers 161, 162.

After removal of the bottom augmentation segment 141 and sacrificial gap layer 130, the lower portion of the vertical fins 111 on the first region 101 can have an exposed height, $H_2$, between the top surface of the substrate 110 and the bottom surface of sidewall spacers 161.

After removal of the sacrificial gap layer 130, the lower portion of the vertical fins 111 on the second region 102 can have an exposed height, $H_1$, between the top surface of the substrate 110 and the bottom surface of sidewall spacers 162, where $H_2>H_1$, and $H_1+L_2=H_2+L_1$, where $L_1$ and $L_2$ are the lengths of sidewall spacers in contact with a sidewall of a vertical fin 111 in the first region or the second region, respectively.

Removal of the bottom augmentation segment 141 and sacrificial gap layer 130 also selectively removes the sacrificial caps 132 and residual layers 142 on the fin templates 120.

Figure 9:
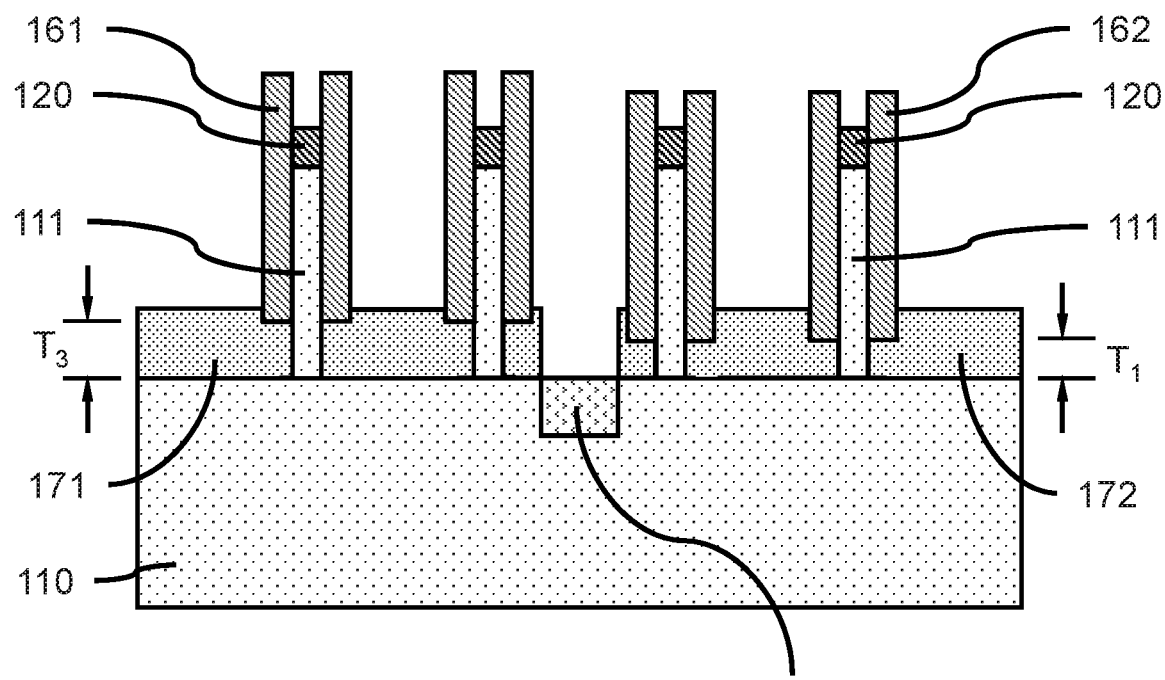
FIG. 9 is a cross-sectional side view showing a bottom source/drain formed on the substrate on a first region and a bottom source/drain formed on the substrate on the second region, in accordance with an embodiment of the present invention.

FIG. 9 is a cross-sectional side view showing a bottom source/drain formed on the substrate on a first region and a bottom source/drain formed on the substrate on the second region, in accordance with an embodiment of the present invention.

In one or more embodiments, a bottom source/drain 171 can be formed on the substrate 110 on a first region 101, and a bottom source/drain 172 can be formed on the substrate 110 on the second region 102, where the bottom source/drain 171 can be in physical contact with the sidewalls of the vertical fin(s) on a first region 101, and the bottom source/drain 172 can be in physical contact with the sidewalls of the vertical fin(s) on a second region 102.

In various embodiments, bottom source/drain 171 and bottom source/drain 172 can be formed by epitaxial growth on the exposed top surface of the substrate 110, where bottom source/drain 171 and bottom source/drain 172 can be grown at the same time. The bottom source/drain 171 and bottom source/drain 172 can be formed to the same thickness, $T_4$, on both the first region and the second region, since the bottom source/drains 171, 172 are grown at the same time. The bottom source/drains may not form on the isolation region 115, since the bottom source/drains would not grow epitaxially on the amorphous material.

The bottom source/drain 171 and bottom source/drain 172 can have the same crystal lattice and orientation as the underlying substrate 110. In various embodiments, the exposed top surface of the substrate 110 can have a {100} crystal face, and the exposed sidewall surfaces of the vertical fins 111 can have {110} or {111} crystal surfaces, such that epitaxial growth occurs faster from the substrate 110 surface than the sidewall surfaces of the vertical fins 111.

In various embodiments, the bottom source/drain 171 and bottom source/drain 172 can be formed to a thickness, $T_4$, greater than $T_3$, where a portion of the bottom source/drain 171 extends above the bottom surface of sidewall spacers 161, and a portion of bottom source/drain 172 extends above the bottom surface of sidewall spacers 162.

In various embodiments, bottom source/drain 171 and bottom source/drain 172 can be in-situ doped (where doping and epitaxy growth are performed at the same time), and/or ex-situ doped (where doping occurs before and/or after epitaxy). Dopants (n-type or p-type) can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain 171 and bottom source/drain 172 can be doped to form n-type or p-type source/drains to fabricate NFETs or PFETs. In various embodiments, in-situ phosphorus doped silicon can be used as the bottom source/drain for NFETs and in-situ boron doped silicon germanium can be used as the bottom source/drain for PFETs.

FIG. 10 is a cross-sectional side view showing vertical fins with different exposed sidewalls lengths after removal of the sidewall spacers, in accordance with an embodiment of the present invention.

In one or more embodiments, the sidewall spacers 161 and sidewall spacers 162 can be removed to expose the portions of the vertical fins not covered by bottom source/drain 171 and bottom source/drain 172. The sidewall spacers 161, 162 can be removed by a selective, isotropic etch (e.g., wet chemical etch). The vertical fins 111 on the first region 101 can have a different exposed sidewall length than the vertical fins 111 on the second region 102. The vertical fins 111 on the first region 101 can have a shorter exposed length than the vertical fins 111 on the second region 102 due to the greater length covered by bottom source/drain 171 adjacent to the vertical fins 111. Removal of the sidewall spacers 161 can expose offset gap 175 in the bottom source/drain 171, where the offset gap 175 is between a first tier 173 of bottom source/drain 171 having a height of $T_3$, and a second tier 174 of bottom source/drain 171 having a height of $T_4$.

Removal of the sidewall spacers 162 can expose offset gap 176 in the bottom source/drain 172, where the offset gap 176 is between a third tier 177 of the bottom source/drain 172 having a height of $T_1$, and a fourth tier 178 of bottom source/drain 172 having a height of $T_4$. The fourth tier can be removed from the vertical fin by width, $G_1$.

In various embodiments, the height of $T_4$ can be greater than the height, $T_1$, and the height, $T_3$, wherein the difference in height, $T_4$, of the second tier and the height, $T_3$, of the first tier can be in the range of about 1 nm to about 4 nm, although other suitable combination of thicknesses are also contemplated.

The width, $G_1$, of offset gaps 175, 176 can be in the range of about 6 nm to about 18 nm, or in the range of about 6 nm to about 15 nm, or in the range of about 9 nm to about 12 nm, although other widths are also contemplated. The first tier can be removed from the vertical fin by offset width, $G_1$. The width, $G_1$, of offset gaps 175, 176 can be sufficient to form a gate dielectric layer of a predetermined thickness without filling in the offset gap 175 to allow formation of a work function layer or gate metal fill to form a gate of a predetermined length adjacent to the sidewall of the vertical fins 111.

Figure 11:
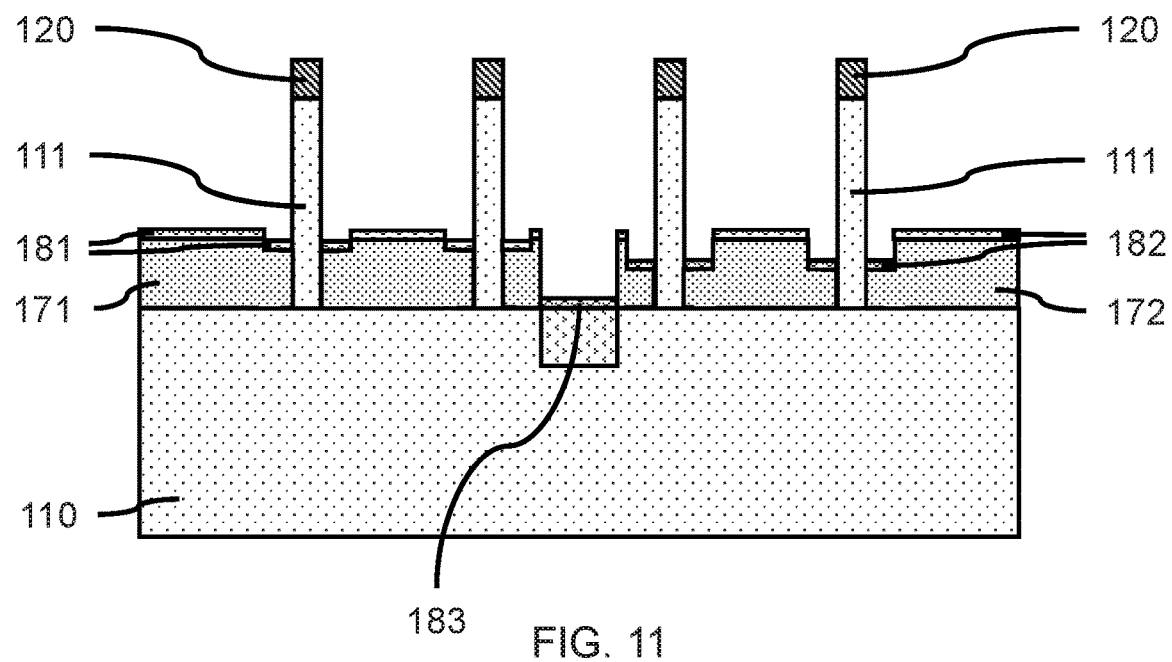
FIG. 11 is a cross-sectional side view showing a bottom spacer layer formed on the exposed surfaces of the bottom source/drains on the first region and the second region, in accordance with an embodiment of the present invention.

FIG. 11 is a cross-sectional side view showing a bottom spacer layer formed on the exposed surfaces of the bottom source/drains on the first region and the second region, in accordance with an embodiment of the present invention.

In one or more embodiments, a first portion 181 of bottom spacer layer can be formed on the exposed surfaces of the bottom source/drain 171 on the first region 101, and a second portion 182 of the bottom spacer layer can be formed on the bottom source/drain 172 on the second region 102, where the bottom spacer layer can be formed on both tiers of the bottom source/drains 171, 172. A third portion 183 of bottom spacer layer can be formed on the isolation region 115. The portions 181, 182, 183 can be formed at the same time, where the portions of bottom spacer layer can be formed by a directional deposition, for example, gas cluster ion beam (GCIB) or high density plasma (HDP), to form the portions 181, 182, 183 on the exposed surfaces of the bottom source/drains 171, 172, and isolation region 115, and not the sidewalls of the vertical fins 111. An isotropic etch can be used to remove deposited or sputtered material from the sidewalls of the vertical fins 111.

In one or more embodiments, the portions 181, 182, 183 of the bottom spacer layer can have a thickness in the range of about 1 nm to about 8 nm, or about 1 nm to about 3 nm.

In one or more embodiments, the bottom spacer layer portions 181, 182, 183 can be silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), or combinations thereof.

Figure 12:
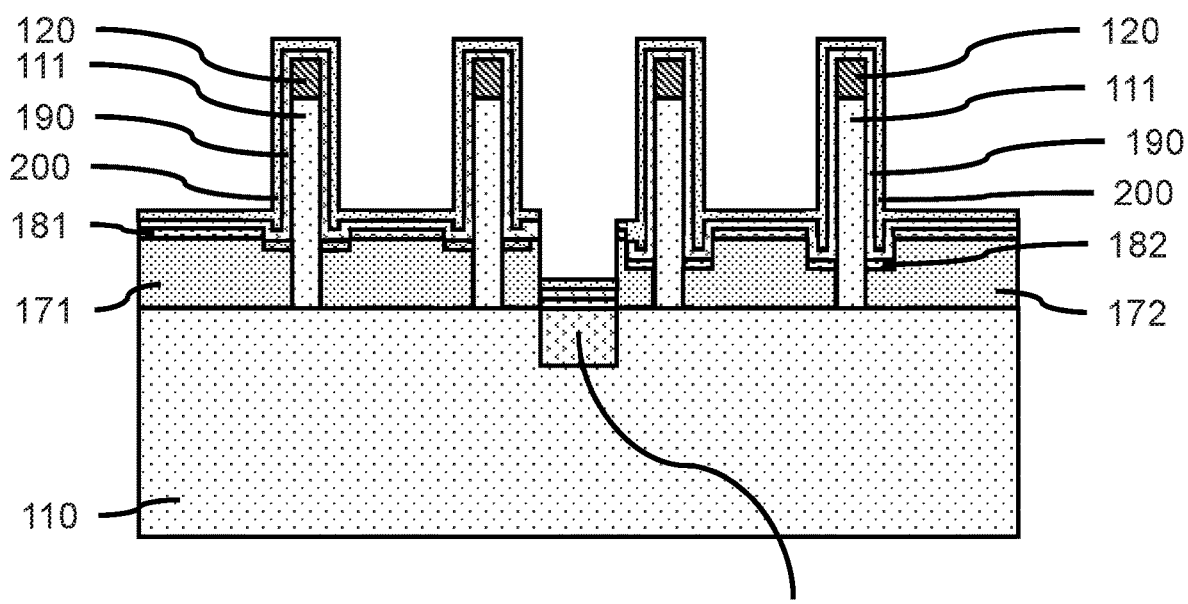
FIG. 12 is a cross-sectional side view showing a work function layer and gate dielectric layer formed on each bottom source/drain and the isolation region, in accordance with an embodiment of the present invention.

FIG. 12 is a cross-sectional side view showing a work function layer and gate dielectric layer formed on each bottom source/drain and the isolation region, in accordance with an embodiment of the present invention.

In one or more embodiments, a gate dielectric layer 190 can be formed on the bottom spacer layer portions 181, 182, 183, bottom source/drains 171, 172, isolation region 115, fin templates 120, and vertical fin sidewalls. The gate dielectric layer 190 can be formed by a conformal deposition (e.g., ALD, PEALD).

In various embodiments, the gate dielectric layer 190 can have a thickness in the range of about 1 nm to about 3 nm, or about 2 nm. In various embodiments, the width, $G_1$, of offset gaps 175, 176 can be about 3× or greater than the predetermined thickness of the gate dielectric layer 190, so the combined thickness of the gate dielectric layer 190 on the sidewalls of the second tier (and/or fourth tier) and the respective adjacent vertical fin 111 does not fill in the offset gaps 175, 176.

In one or more embodiments, a gate dielectric layer 190 can be silicon oxide (SiO), silicon nitride (SiN), silicon oxynitride (SiON), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO). The high-k material can further include dopants such as lanthanum (La) and aluminum (Al).

In one or more embodiments, a work function layer 200 can be formed on the gate dielectric layer 190. The work function layer 200 can be formed by a conformal deposition (e.g., ALD, PEALD). The work function layer 200 can fill in the offset gaps.

In various embodiments, the work function layer 200 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 13:
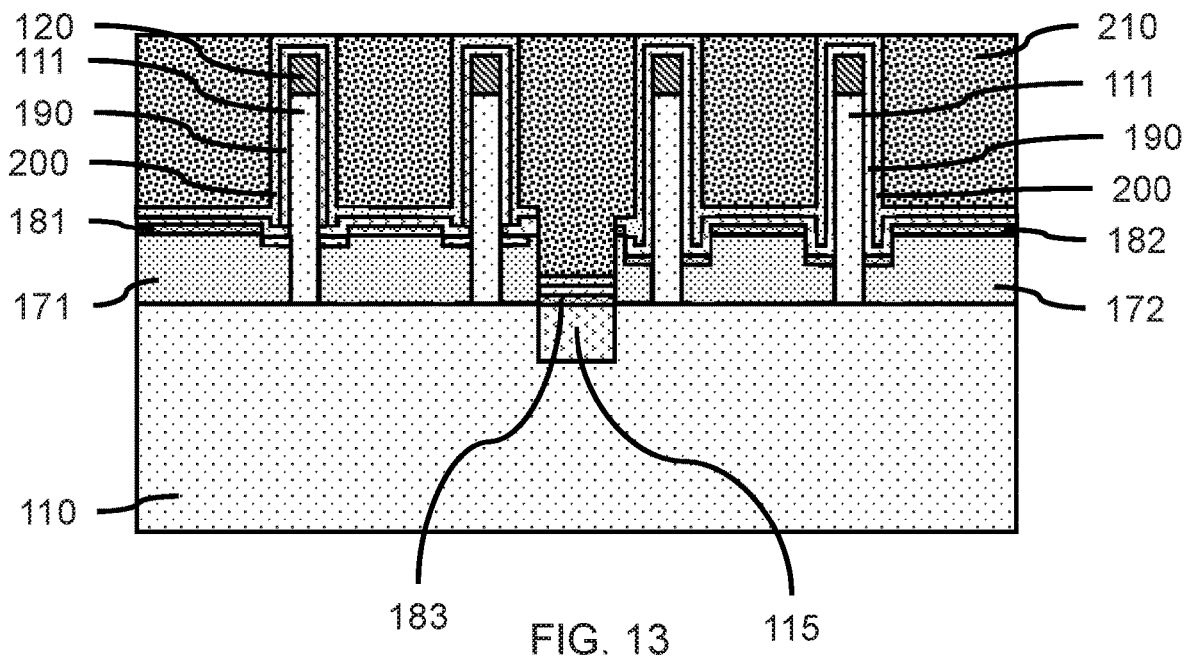
FIG. 13 is a cross-sectional side view showing a gate fill layer formed on the work function layer on each bottom source/drain, in accordance with an embodiment of the present invention.

FIG. 13 is a cross-sectional side view showing a gate fill layer formed on the work function layer on each bottom source/drain, in accordance with an embodiment of the present invention.

In one or more embodiments, a conductive gate fill layer 210 can be formed on the gate dielectric layer 190 and work function layer 200, where the conductive gate fill layer 210 can be formed by a blanket deposition (e.g., CVD, PECVD, PVD, etc.). The conductive gate fill layer 210 can extend above the top surfaces of the work function layer 200 and/or gate dielectric layer 190 on the top surfaces of the vertical fins 111. The conductive gate fill layer 210 can be etched back and/or a CMP can be used to reduce the height of the conductive gate fill layer 210 to the top surface of the work function layer.

In various embodiments, the conductive gate fill layer 210 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), cobalt silicide (CoSi), nickel silicide (NiSi)), carbon nanotube(s) (CNTs), conductive carbon, graphene, or any suitable combination of these materials. The conductive gate fill layer material can further include dopants that are incorporated during or after formation (e.g., deposition). In various embodiments, the work function layer 200 can serve as a gate conductor without a conductive gate fill layer 210.

Figure 14:
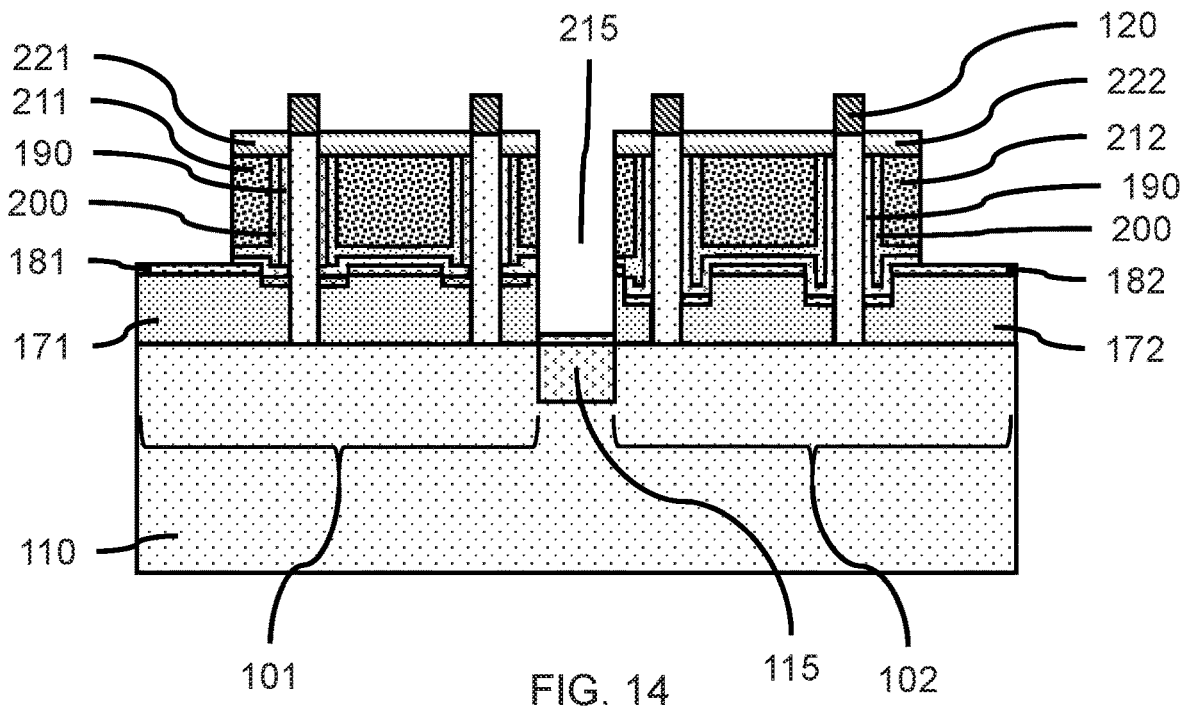
FIG. 14 is a cross-sectional side view showing a gate structure formed on the vertical fins on each bottom source/drain, in accordance with an embodiment of the present invention.

FIG. 14 is a cross-sectional side view showing a gate structure formed on the vertical fins on each bottom source/drain, in accordance with an embodiment of the present invention.

In one or more embodiments, the conductive gate fill layer 210, work function layer 200 and gate dielectric layer 190 can be masked and etched to form a gate structure on the vertical fin(s) in the first region 101, and a gate structure on the vertical fin(s) 111 in the second region 102. A trench 215 can be formed between a gate structure in the first region 101 and a gate structure in the second region 102, where the trench 215 can be over the isolation region 115 to physically and electrically separate the gate structure on the first region from the gate structure on the second region.

In one or more embodiments, a first top spacer 221 can be formed on the first conductive gate electrode 211, work function layer 200 and gate dielectric layer 190 forming the gate structure on the vertical fin(s) in the first region 101. A second top spacer 222 can be formed on the second conductive gate electrode 212, work function layer 200 and gate dielectric layer 190 forming the gate structure on the vertical fin(s) in the first region 101. First top spacer 221 and second top spacer 222 can be formed at the same time through suitable masking, patterning, etching, and deposition. First top spacer 221 and second top spacer 222 can be formed by a blanket deposition, for example, CVD or PECVD, of a top spacer layer, and divided by trench 215. First top spacer 221 and second top spacer 222 can be formed by a directional deposition, for example, gas cluster ion beam (GCIB) deposition, or high density plasma (HDP) deposition.

In one or more embodiments, top spacer 221 and top spacer 222 can be formed of a dielectric material selected from the group consisting of silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), a boron carbide (BC), a boron nitride (BN), and combinations thereof.

Figure 15:
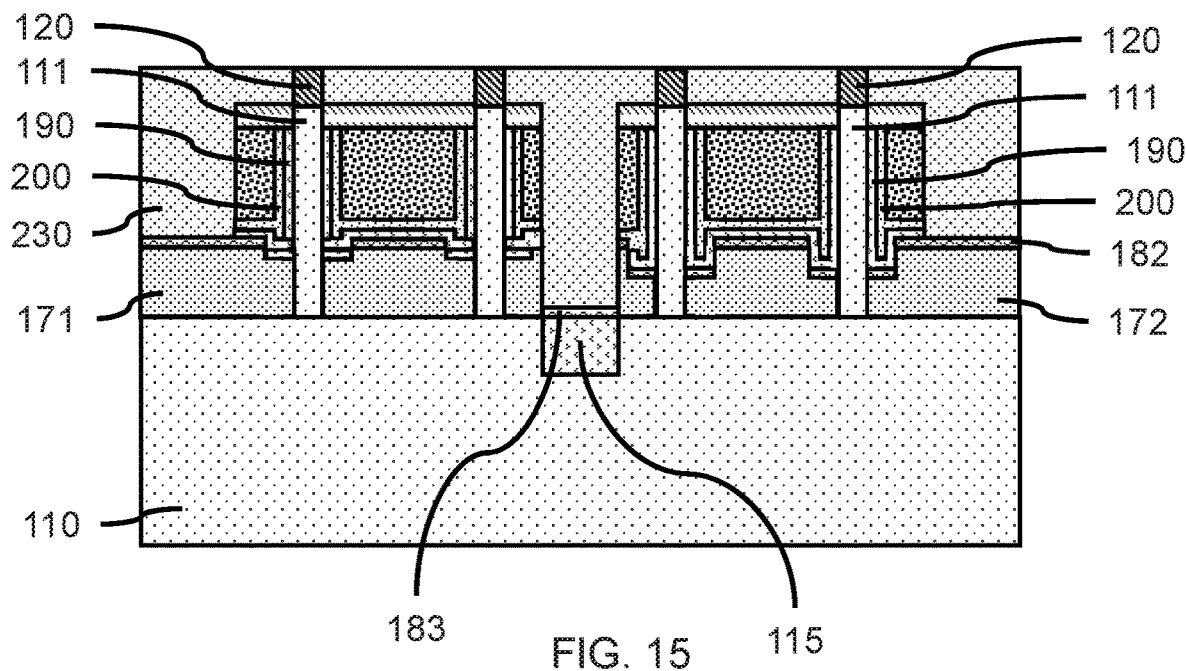
FIG. 15 is a cross-sectional side view showing an interlayer dielectric layer on the gate structures and substrate, in accordance with an embodiment of the present invention.

FIG. 15 is a cross-sectional side view showing an interlayer dielectric layer on the gate structures and substrate, in accordance with an embodiment of the present invention.

In one or more embodiments, an interlayer dielectric (ILD) layer 230 can be formed on the gate structure(s) on the vertical fin(s) in the first region 101, and the gate structure(s) on the vertical fin(s) 111 in the second region 102, as well as filling in the trench 215 between the gate structures and over the isolation region 115. The ILD layer 230 can extend above the top surfaces of the fin templates 120, and a chemical-mechanical polishing (CMP) can be used to reduce the height of the ILD layer to expose the top surface of the fin templates 120 and provide a smooth, flat surface.

The ILD layer 230 can be formed of a dielectric material selected from the group consisting of silicon oxide (SiO), a low-K insulating dielectric, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof.

Figure 16:
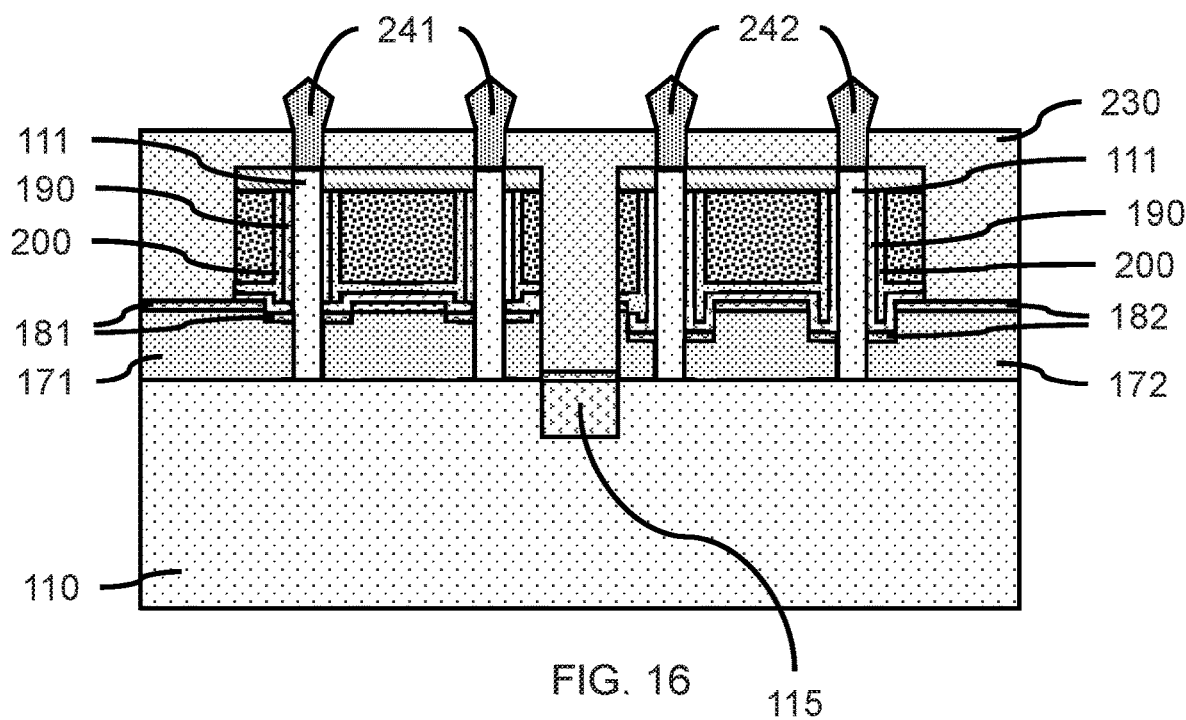
FIG. 16 is a cross-sectional side view showing a top source/drain formed on each vertical fin after removal of the fin templates, in accordance with an embodiment of the present invention.

FIG. 16 is a cross-sectional side view showing a top source/drain formed on each vertical fin after removal of the fin templates, in accordance with an embodiment of the present invention.

In one or more embodiments, the fin templates 120 can be removed to form openings in the ILD layer 230 and expose the top surfaces of the vertical fins 111. The fin templates 120 can be removed by a selective etch.

In one or more embodiments, a top source/drain can formed on each vertical fin after removal of the fin templates, where top source/drains 241 can be formed on the vertical fin(s) 111 in the first region 101, and top source/drains 242 can be formed on the vertical fin(s) 111 in the second region 102. The top source/drains 241 and top source/drains 242 can be physically and electrically separated by the ILD layer 230.

The top source/drains 241 and top source/drains 242 can be formed by epitaxial growth on the exposed the top surfaces of the vertical fins 111. The top source/drains 241 can be doped to by n-type top source/drains, and top source/drains 242 can be doped to be p-type top source/drains, wherein the gate structure and vertical fin(s) 111 in the first region 101 can form an NFET and the gate structure and vertical fin(s) 111 in the second region 102 can form a PFET. The NFET and PFET can be electrically coupled to form a complementary metal-oxide-semiconductor (CMOS) device.

Figure 17:
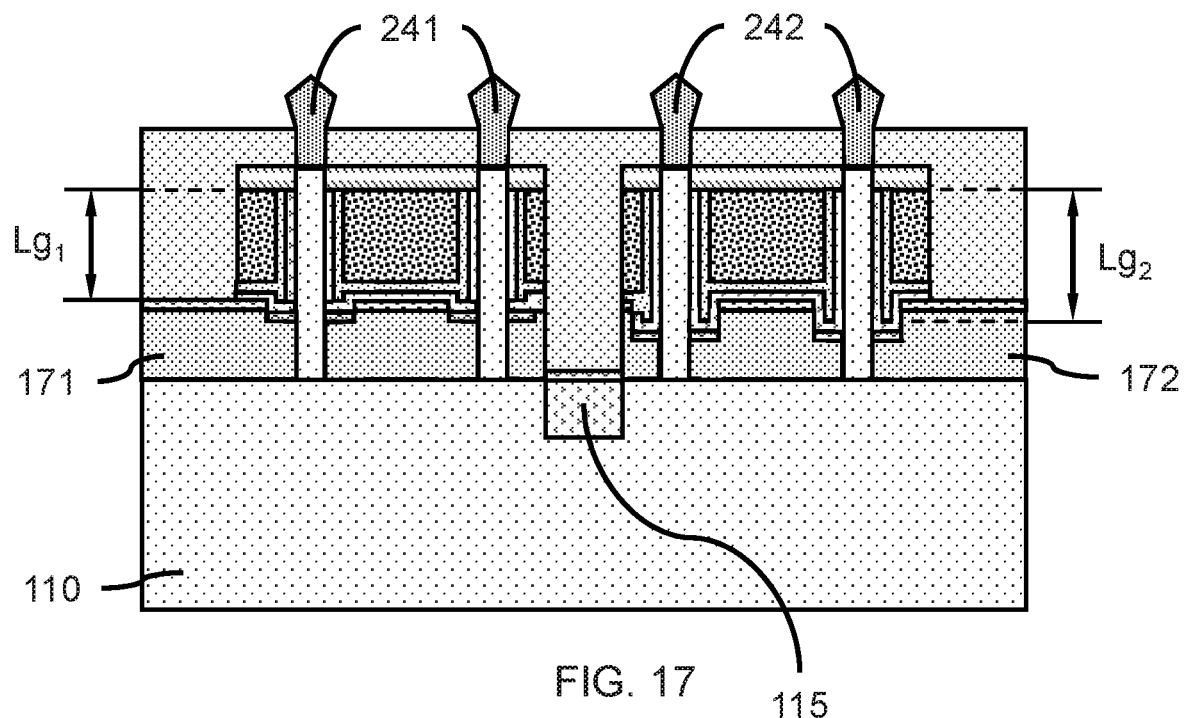
FIG. 17 is a cross-sectional side view showing the different gate lengths for each gate structure, in accordance with an embodiment of the present invention.

FIG. 17 is a cross-sectional side view showing the different gate lengths for each gate structure, in accordance with an embodiment of the present invention.

In one or more embodiments, the work function layer 200 and first conductive gate electrode 211 can form a gate structure on the vertical fin(s) 111 in the first region 101 with a gate length, $Lg_1$. The work function layer 200 and second conductive gate electrode 212 can form a gate structure on the vertical fin(s) 111 in the second region 102 with a gate length, $Lg_2$. Gate length, $Lg_1$ can be less than gate length, $Lg_2$ due to the greater thickness of bottom source/drain 171 covering a greater portion of the vertical fin(s) 111 in the first region 101. Gate length, $Lg_2$, can be longer due to the lesser thickness of bottom source/drain 172 covering a smaller portion of the vertical fin(s) 111 in the second region 102.

Figure 18:
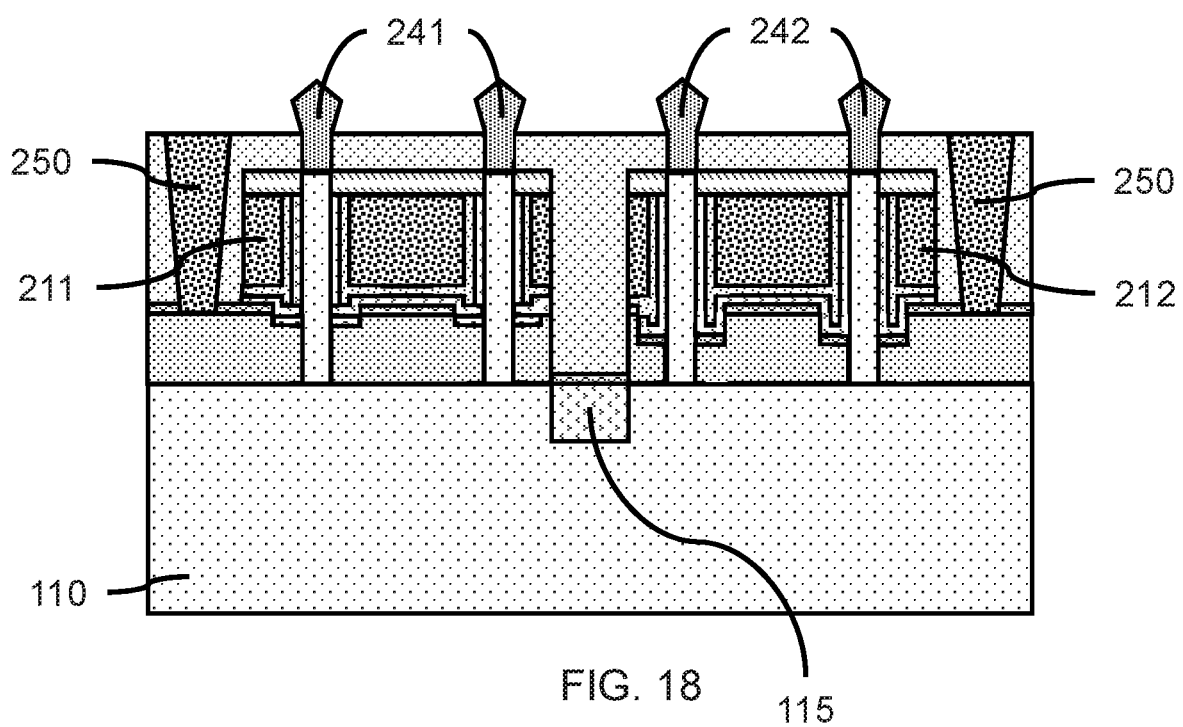
FIG. 18 is a cross-sectional side view showing a source/drain contact formed to each bottom source/drain, in accordance with an embodiment of the present invention.

FIG. 18 is a cross-sectional side view showing a source/drain contact formed to each bottom source/drain, in accordance with an embodiment of the present invention.

In one or more embodiments, a via can be formed in the ILD layer 230 to the bottom source/drain 171 in the first region 101, and a via can be formed in the ILD layer to the bottom source/drain 172 in the second region 102. A source/drain contact 250 can be formed in each via to each respective bottom source/drain 171, 172.

The source/drain contacts 250 can be a conductive material, including but not limited to tungsten, titanium, tantalum, ruthenium, zirconium, cobalt, tantalum nitride, titanium nitride, cobalt silicide, nickel silicide, carbon nanotube, conductive carbon, graphene, or any suitable combination of these materials.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options, etc.

The terminology used herein is for the purpose of describing particular embodiments only and is plot intended to be limiting f example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above d below. In addition, it will also be understood that when a layer s referred to as being "between" layers, it can be the only layer between the two layer, or one or more intervening layers can also be present.

Having described preferred embodiments of vertical transistors with multiple gate lengths and fabrication methods thereof (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a pair of vertical fin field effect transistors (FinFETs) having different gate lengths, comprising:
   forming a first bottom source/drain on a first region of a substrate adjoining a first vertical fin, wherein the first bottom source/drain has a first offset gap adjacent to the first vertical fin with a height of T3;
   forming a second bottom source/drain on a second region of the substrate adjacent to a second vertical fin, wherein the second bottom source/drain has a second offset gap adjacent to the second vertical fin with a height of T1 that is less than T3;
   forming a first portion of a bottom spacer layer in the first offset gap and a second portion of the bottom spacer layer in the second offset gap; and
   forming a gate dielectric layer on the first portion of the bottom spacer layer and the second portion of the bottom spacer layer, wherein the gate dielectric layer does not fill in the offset gaps.

2. The method of claim 1, wherein the difference in height between T1 and T3 is in the range of about 1 nm to about 4 nm.

3. The method of claim 1, wherein the first offset gap and the second offset gap have a width in the range of about 6 nm to about 18 nm.

4. The method of claim 3, wherein the gate dielectric layer has a thickness in the range of about 1 nm to about 3 nm.

5. The method of claim 4, further comprising forming a work function layer on the gate dielectric layer, wherein the work function layer fills in the first offset gap and defines a first gate length on the first vertical fin and fills in the second offset gap and defines a second gate length on the second vertical fin.

6. The method of claim 5, further comprising forming a conductive gate fill layer on the work function layer.

7. The method of claim 6, wherein the first portion and the second portion of the bottom spacer layer are formed by a directional deposition.

8. The method of claim 6, wherein the first portion and the second portion of the bottom spacer layer each have a thickness in the range of about 1 nm to about 8 nm.

9. A method of forming a pair of vertical fin field effect transistors (FinFETs) having different gate lengths, comprising:
   forming a first bottom source/drain on a first region of a substrate adjoining a first vertical fin, wherein the first bottom source/drain has a first offset gap adjacent to the first vertical fin with a height of T3;
   forming a second bottom source/drain on a second region of the substrate adjacent to a second vertical fin, wherein the second bottom source/drain has a second offset gap adjacent to the second vertical fin with a height of T1 that is less than T3;
   forming a first portion of a bottom spacer layer in the first offset gap and a second portion of the bottom spacer layer in the second offset gap;
   forming a first gate structure on the first vertical fin in the first region with a first gate length, $Lg_1$; and
   forming a second gate structure on the second vertical fin in the seco d region with a second gate length, $Lg_2$, wherein the first gate length, $Lg_1$ is less than the second gate length, $Lg_2$ due to the difference in the height of T1 compared to T3.

10. The method of claim 9, further comprising, forming an isolation region in the substrate between the first vertical fin and the second vertical fin.

11. The method of claim 10, wherein the isolation region has a width in a range of about 100 nm to about 250 nm.

12. The method of claim 10, further comprising forming a first top spacer on the first gate structure and forming a second top spacer on the second gate structure at the same time.

13. The method of claim 12, further comprising forming an interlayer dielectric (ILD) layer on the gate structures.

14. The method of claim 13, further comprising forming a top source/drain on each of the first vertical fin and the second vertical fin.

15. A method of forming a pair of vertical fin field effect transistors (FinFETs) having different gate lengths, comprising:
   forming an isolation region in a substrate to divide the substrate into a first region and a second region;
   forming a first bottom source/drain adjoining a first vertical fin on the first region of the substrate, wherein the first bottom source/drain includes a first tier having a first height adjacent to the first vertical fin and a second tier having a second height greater than the first tier;
   forming a second bottom source/drain adjoining a second vertical fin on the second region of the substrate, wherein the second bottom source/drain includes a third tier having a third height adjacent to the second vertical fin and a fourth tier having a fourth height greater than the third tier.

16. The method of claim 15, forming a first portion of a bottom spacer layer on the first tier and the second tier and a second portion of the bottom spacer layer on the third tier and the fourth tier.

17. The method of claim 16, wherein the first portion and the second portion of the bottom spacer layer are formed by a directional deposition.

18. The method of claim 16, forming a gate dielectric layer on the first portion of the bottom spacer layer and the second portion of the bottom spacer layer.

19. The method of claim 18, further comprising forming a work function layer on the gate dielectric layer, wherein the work function layer defines a first gate length on the first vertical fin and defines a second gate length on the second vertical fin.

20. The method of claim 19, further comprising forming a conductive gate fill layer on the work function layer.

* * * * *